US00RE38144E

(19) United States
(12) Reissued Patent
Draxelmayr

(10) Patent Number: US RE38,144 E
(45) Date of Reissued Patent: Jun. 17, 2003

(54) COMB FILTER

(75) Inventor: Dieter Draxelmayr, Villach (AT)

(73) Assignee: Siemens Aktiengesellschaft, Munich (DE)

(21) Appl. No.: 09/874,693

(22) Filed: Jun. 5, 2001

Related U.S. Patent Documents

Reissue of:
(64) Patent No.: 6,034,628
Issued: Mar. 7, 2000
Appl. No.: 09/317,761
Filed: May 24, 1999

U.S. Applications:

(63) Continuation of application No. PCT/DE98/02453, filed on Aug. 21, 1998.

(30) Foreign Application Priority Data

Sep. 23, 1997 (DE) ..... 197 41 922

(51) Int. Cl.[7] ..... H03M 7/00
(52) U.S. Cl. ..... 341/61; 708/313
(58) Field of Search ..... 341/61; 708/313

(56) References Cited

U.S. PATENT DOCUMENTS 4,872,129 A * 10/1989 Pfeifer et al. ..... 364/724.1
5,227,991 A * 7/1993 Lay et al. ..... 364/724.1
5,381,356 A * 1/1995 Takahashi ..... 364/724.17
5,455,782 A * 10/1995 Young et al. ..... 364/724.1
5,880,973 A * 3/1999 Gray et al. ..... 364/724.1

FOREIGN PATENT DOCUMENTS

EP 0 762 647 A1 * 3/1997

* cited by examiner

*Primary Examiner*—Howard L. Williams
(74) *Attorney, Agent, or Firm*—Laurence A. Greenberg; Werner H. Stemer; Ralph E. Locher

(57) ABSTRACT

A comb filter has series connected integrators to which is fed a digital data stream at a high sampling rate in order to yield a digital data stream at a low sampling rate. The most significant bits of the digital data stream are reset in the first and second integrators, the resetting of the bits in the first integrator being stored in a counter. The counter reading of the counter is fed into the most significant bits of the last integrator at a reset time.

6 Claims, 2 Drawing Sheets

COMB FILTER

Matter enclosed in heavy brackets [ ] appears in the original patent but forms no part of this reissue specification; matter printed in italics indicates the additions made by reissue.

CROSS-REFERENCE TO RELATED APPLICATION

This application is a continuation of copending International Application No. PCT/DE98/02453, filed Aug. 21, 1998, which designated the United States.

BACKGROUND OF THE INVENTION

Field of the Invention

The invention relates to a comb filter containing series connected integrators, to which is fed a digital data stream at a high sampling rate in order to yield a digital data stream at a low sampling rate.

So called decimation filters are used to convert a digital data stream having a high sampling rate into a data stream having a low sampling rate. The filter function of such decimation filters usually has low pass filter properties and effects an increase in the word width of the data decimated by the decimation filter. A 1 bit stream at a high sampling rate can thus be decimated into, for example, 16 bit words in the voice band.

One field of application is digital telephony. In this case, at least one such decimation filter is connected downstream of a Sigma Delta analog/digital converter.

The decimation factor of a decimation filter is usually determined by a power of two, that is to say 2, 4, 16, 64, etc. The usual structure for such a decimation filter is afforded by a comb filter, since a filter of the latter type can be realized with a relatively low outlay.

SUMMARY OF THE INVENTION

It is accordingly an object of the invention to provide a comb filter which overcomes the above-mentioned disadvantages of the prior art device of this general type, which is suitable as a decimation filter and is distinguished by a simple structure.

With the foregoing and other objects in view there is provided, in accordance with the invention, a comb filter, including:

at least three series connected integrators, having a first integrator and a last integrator, receiving at a high sampling rate a digital data stream having bits including most significant bits in order to yield the digital data stream at a low sampling rate; and a counter generating a counter reading connected to the first integrator and to the last integrator, the most significant bits of the digital data stream being reset in the at least three series connected integrators, the counter storing a resetting of the bits in the first integrator, and the counter reading of the counter fed selectively into at least one bit of the bits of the last integrator at a reset time.

In the case of the comb filter of the type mentioned in the introduction, the object is achieved according to the invention by virtue of the fact that the most significant bits of the digital data stream can be reset in the integrators, that it is possible to store the resetting of the bits in the first integrator in a counter, and that the counter reading of the counter can be fed into at least one bit, preferably the most significant bits, of the last integrator at the reset time.

The invention has the advantage that a reset error appears as a multiple of a power of two in subsequent stages, with the result that it can be connected in a particularly simple manner in the subsequent stages.

In this case, the number of integrators is not limited in principle, although three integrators are sufficient in many applications. Correspondingly, reference is made below to exemplary embodiments having three integrators, i.e. third order filters.

In the case of the comb filter according to the invention, unlike in the known comb filter of FIG. 2, therefore, the reset signal is not passed to the integrators in their entirety, rather it is applied only to the most significant bits. The result of this is that just a simple counter is required as the arithmetic unit for the correction of the reset errors. In particular, the last integrator, and that is to say the third integrator in the case of a three stage configuration, is preset not to zero but to a value determined by the counter.

The reasons for this shall be explained in more detail below:

A third order comb filter with a decimation factor of 256 ($2^8$) has a number range from zero to $256^3$ (16,777,216). If the representation of $256^3$ is then dispensed with and the value zero is accepted for this, then 24 bits are necessary for a representation. 25 bits would be required in the case of a representation of $256^3$, which results in that the following considerations shift by 1 bit. Computational errors modulo $256^3$ accordingly are not noticeable and can be ignored. Thus, a computational accuracy of 24 bits suffices in order to obtain an exact result.

If an error f1 occurs in the first integrator at a particular time, which may happen as a result of resetting, for example, then the error is evaluated after 256 clock cycles at the output of the third integrator, where the error is then $f3=f1*256*257/2=f1*128*(256+1)$. If the error f1 amounts to $a*512$, for example, then $f3=a*512*128*256+a*512*128$ is produced. In other words, $a*256^2$ when considered modulo $256^3$.

This results in the following:

If the third integrator is set not to the value zero but to the value $-a*256*256$, then the error f1 is compensated for. The same applies correspondingly not just to 256 clock cycles but also to any desired multiples thereof. The reason is that the third integrator simultaneously operates as a differentiator as well, and that when the accumulating values are differentiated, $-a*256*256$ is always present as the result.

In this case, the value of a is produced as shown next. In the first integrator, the bit with the significance of 512 is reset at the reset time. If the bit previously had the value 1, then the error f1 specified above is produced exactly. This error is added to the preceding errors that occurred correspondingly. Therefore, the error counter of the first integrator is simply incremented in this case. The error counter loads, in turn, the last or third integrator. The negative sign disappears because a is usually negative, since the error arises when a bit is reset.

In order, furthermore, to prevent the occurrence of any further errors, the first integrator must always have a width of 10 bits. The error counter, which is connected downstream of the first integrator, contains multiples of $256^2$ and must accordingly have a width of 8 bits, since an overall computational accuracy of 24 bits is presupposed. That is to say that a "small" counter is sufficient.

Therefore, values up to a maximum of 767 come from the first integrator. In 256 clock cycles, this value can accumulate to at most values of less than/equal to 767*256=196352. The start value of the second integrator is less than 216, with the result that a word width of 18 bits is sufficient to avoid an uncontrolled overflow. At the reset time, all bits which symbolize 216 and multiples thereof can be erased because, after 256 clock cycles, the accumulative error in the third integrator has the value 224 or a multiple thereof and, therefore, need not be taken into account. That is to say that the start value after resetting is in the second integrator, in other words has values which are less than 216, as has already been assumed above.

Overall, the comb filter according to the invention therefore operates in the below list manner.

Synchronous resetting of the most significant bits is performed by 1 bit in the first integrator and by 2 bits in the second integrator. In this case, the resetting of the bits in the first integrator is stored in an error counter that is connected downstream of the first integrator and has a word width of 8 bits. The counter reading thus determined is then fed into the most significant bits of the last or third integrator, which simultaneously acts as a differentiator, at the reset time. The less significant bits of the last or third integrator are reset in a customary manner, further computational steps not being necessary. The invention thus provides a comb filter that is constructed in a simple manner, can be realized with a low outlay and can reliably convert a digital data stream having a high sampling rate into a digital data stream having a lower sampling rate.

Other features which are considered as characteristic for the invention are set forth in the appended claims.

Although the invention is illustrated and described herein as embodied in a comb filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
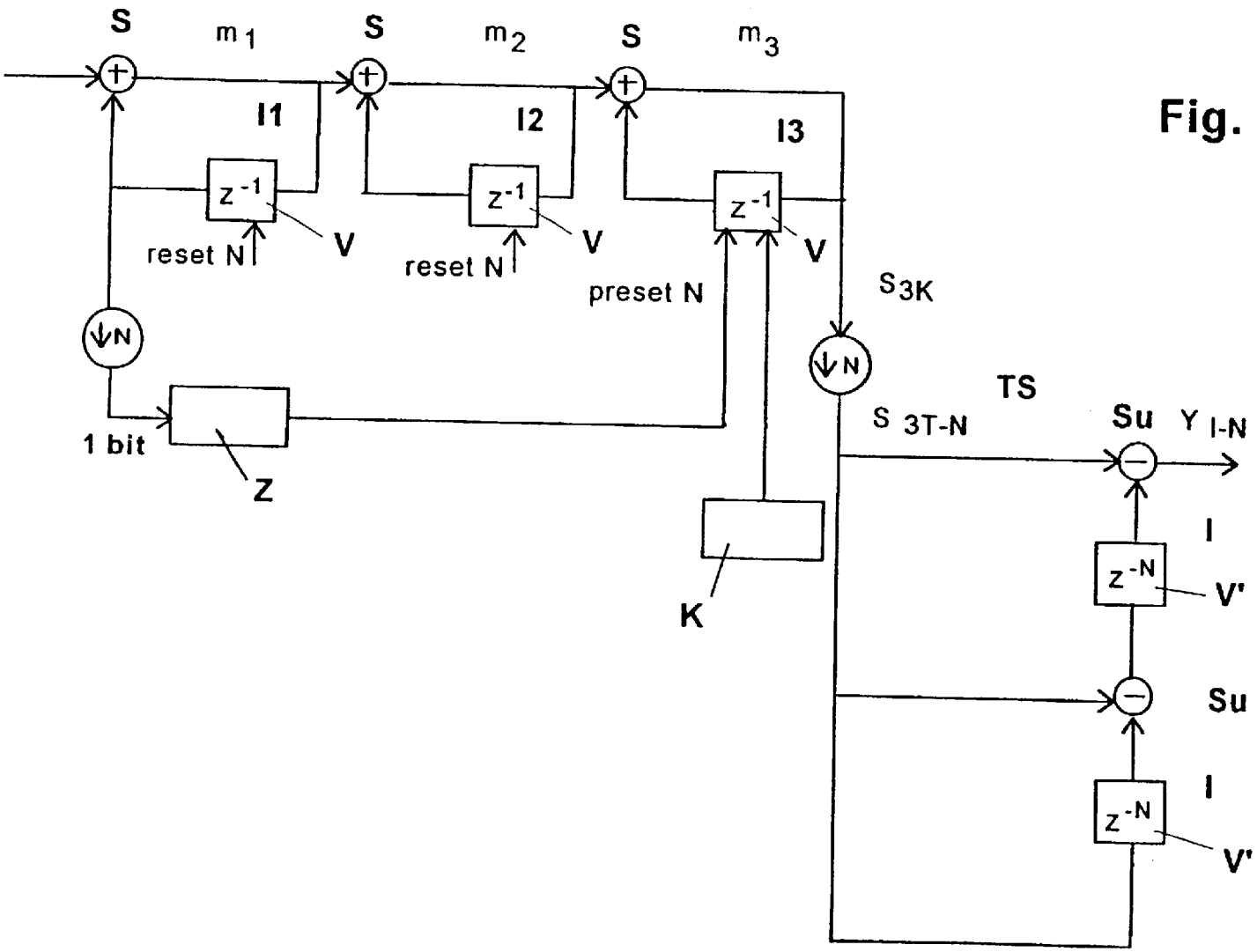
FIG. 1 is a diagrammatic, block diagram f a comb filter according to the invention.

In all the figures of the drawing, sub-features and integral parts that correspond to one another bear the same reference symbol in each case. Referring now to the figures of the drawings in detail and first, particularly, to FIG. 2 thereof, there is shown an example of a known comb or decimation filter. The comb filter has three so-called Dump integrators I (I1, I2, I3) connected in cascade and in each case have a summation element S and a delay element V connected in a feedback path. The Dump integrators I are reset after N clock cycles in each case via the associated delay element V, which is indicated by "reset N". The respective word width $m_1$ and $m_2$ and $m_3$ of the output data stream of the summation elements S can be adapted to the Dump integrators I.

A traversal superposition stage TS containing further summation elements, delay elements V having an N fold delay and multipliers M is connected downstream of the cascade circuit containing the integrators I with N designating the summation factor.

Figure 2:
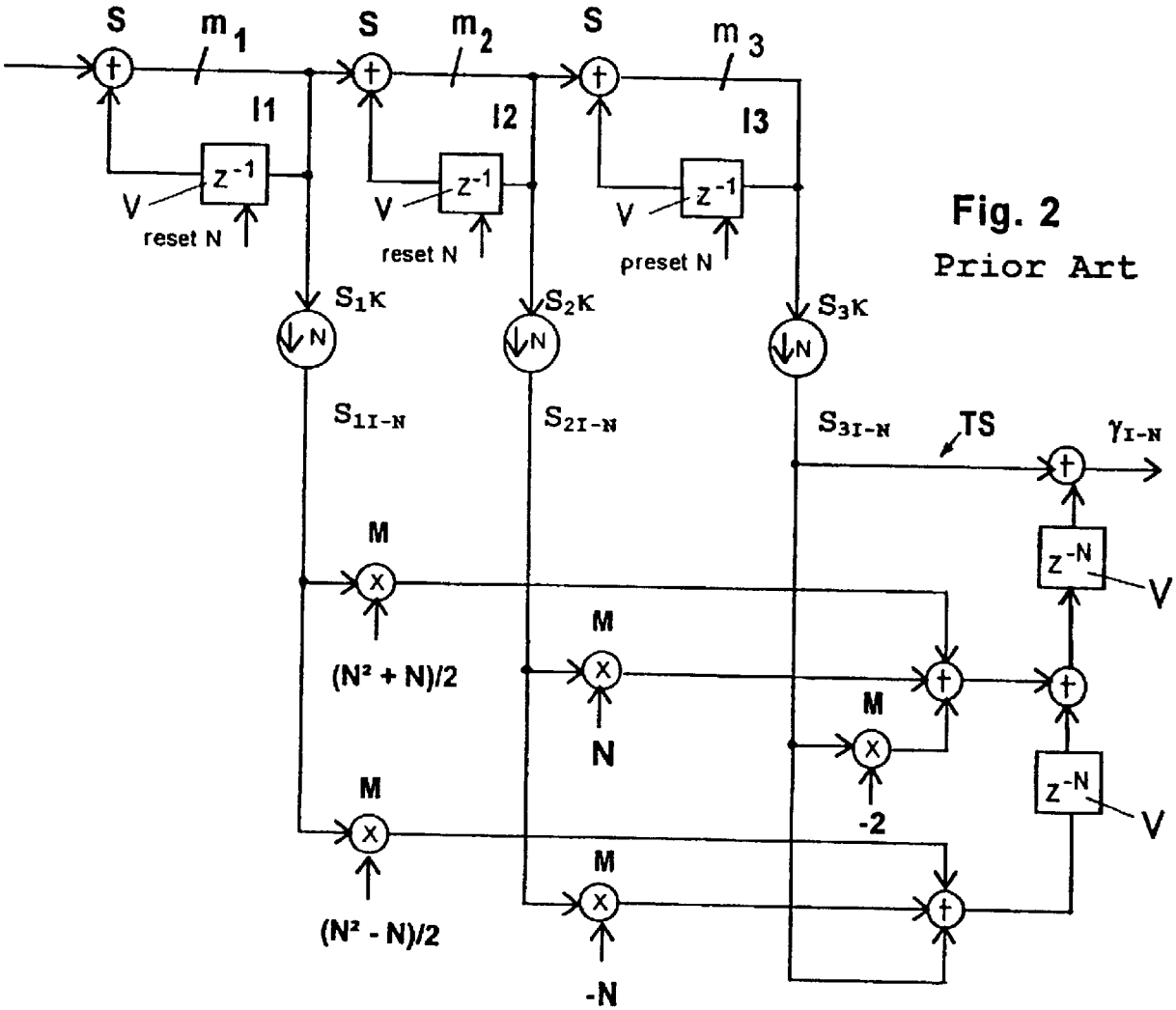
Fig. 2 Prior Art
FIG. 2 is a block diagram of a conventional comb filter.

According to the invention and as shown in FIG. 1, the three integrators, I1, I2 and I3, with the summers S are disposed in a cascade as in FIG. 2. It is possible for the respective word within m1, m2 and m3 to be adapted to the integrators I1, I2 and I3. In contrast to the existing comb filter in accordance with FIG. 2, in the case of the comb filter according to the invention, a counter Z having a word width of 8 bits is connected downstream of the integrator I1. The counter Z counts the resetting of the bits in the integrator I1. A counter reading thus determined in the counter Z is then fed into the most significant bits of the third integrator I3, which simultaneously acts as a differentiator, at the reset time, while the less significant bits of the third integrator I3 are reset in a customary manner. The entire delay element is reset; selective resetting is not provided.

In the case of the cascade circuit containing the integrators I1, I2 and I3, the transversal superposition stage TS containing the subtractors Su and the integrators I is once again connected downstream.

A correction value that can be chosen as desired and is stored in a register K may optionally be input into the third integrator I3 via the register K.

As the simplest configuration of the integrator I, it is possible to use a counter for this purpose. That is because, for example, a maximum of one bit can be added in the first integrator at each time step, which corresponds to a counter step of 1. This also applies to more significant bits in he downstream integrators, since only the overflows of the less significant bits are fed in there.

I claim:

1. A comb filter, comprising:

at least three series connected integrators, including a first integrator and a last integrator, receiving at a high sampling rate a digital data stream having bits including most significant bits in order to yield the digital data stream at a low sampling rate; and a counter generating a counter reading connected to said first integrator and to said last integrator, the most significant bits of the digital data stream being reset in said at least three series connected integrators, said counter storing a resetting of the bits in said first integrator, an the counter reading of said counter fed selectively into at least one bit of the bits of said last integrator at a reset time.

2. The comb filter according to claim 1, wherein the counter reading of said counter can be fed into the most significant bits of said last integrator at the reset time.

3. The comb filter according to claim 1, wherein said last integrator simultaneously acts as a differentiator.

4. The comb filter according to claim 1, including a correction value being fed into the most significant bits of said last integrator.

5. The comb filter according to claim 4, wherein the correction value being fed is received from said counter.

6. The comb filter according to claim 1, wherein said at least three series connected integrators are counters.

* * * * *